(12) United States Patent
Kim

(10) Patent No.: US 8,405,437 B2
(45) Date of Patent: Mar. 26, 2013

(54) SYNCHRONIZATION CIRCUIT

(75) Inventor: Kyung Hoon Kim, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 4 days.

(21) Appl. No.: 13/190,079

(22) Filed: Jul. 25, 2011

(65) Prior Publication Data

US 2012/0177158 A1  Jul. 12, 2012

(30) Foreign Application Priority Data

Jan. 11, 2011  (KR) .................. 10-2011-0002655

(51) Int. Cl.
*H03L 7/06* (2006.01)
(52) U.S. Cl. .............................. 327/158; 327/149
(58) Field of Classification Search .............. 327/149, 327/158
See application file for complete search history.

(56) References Cited

U.S. PATENT DOCUMENTS

| | | | | |
|---|---|---|---|---|
| 5,483,180 A * | 1/1996 | Chai et al. | ...................... | 326/93 |
| 5,610,954 A * | 3/1997 | Miyashita et al. | ............ | 375/375 |
| 5,889,828 A * | 3/1999 | Miyashita et al. | ............ | 375/374 |
| 6,525,615 B1 * | 2/2003 | Masenas et al. | ................ | 331/34 |
| 6,868,504 B1 * | 3/2005 | Lin | ............................... | 713/500 |
| 6,876,874 B2 * | 4/2005 | Arnaud et al. | ................ | 455/574 |
| 6,912,666 B2 * | 6/2005 | Lin | ................................ | 713/401 |
| 7,209,533 B1 * | 4/2007 | Nguyen et al. | ................ | 375/376 |
| 7,633,323 B2 * | 12/2009 | Lee | ................................ | 327/158 |
| 2004/0119512 A1 * | 6/2004 | Lin | ................................ | 327/156 |
| 2004/0158757 A1 * | 8/2004 | Lin | ................................ | 713/401 |
| 2006/0077297 A1 * | 4/2006 | Sonobe | ........................ | 348/536 |
| 2008/0100357 A1 * | 5/2008 | Bae | ................................. | 327/158 |
| 2008/0157838 A1 * | 7/2008 | Lee | ................................. | 327/158 |
| 2009/0289683 A1 * | 11/2009 | Wong | ........................... | 327/232 |
| 2010/0321076 A1 * | 12/2010 | Bae et al. | ..................... | 327/158 |
| 2011/0156779 A1 * | 6/2011 | Kim | ............................. | 327/158 |
| 2012/0068741 A1 * | 3/2012 | Kim | ............................. | 327/147 |
| 2012/0153999 A1 * | 6/2012 | Kim | ............................. | 327/157 |
| 2012/0177158 A1 * | 7/2012 | Kim | ............................. | 375/354 |
| 2012/0194240 A1 * | 8/2012 | Kim et al. | ..................... | 327/158 |
| 2012/0194241 A1 * | 8/2012 | Shin | ............................. | 327/158 |
| 2012/0212268 A1 * | 8/2012 | Kim | ............................. | 327/158 |

FOREIGN PATENT DOCUMENTS

| KR | 100673135 B1 | 1/2007 |
|---|---|---|
| KR | 100937949 B1 | 1/2010 |

* cited by examiner

*Primary Examiner* — Adam Houston
(74) *Attorney, Agent, or Firm* — William Park & Associates Ltd.

(57) ABSTRACT

A synchronization circuit includes a delay line, and a first loop and a second loop configured to share the delay line, and the second loop is activated when a number of unit delay cells used in the delay line is equal to or less than a predetermined number according to an operation of the first loop.

24 Claims, 11 Drawing Sheets

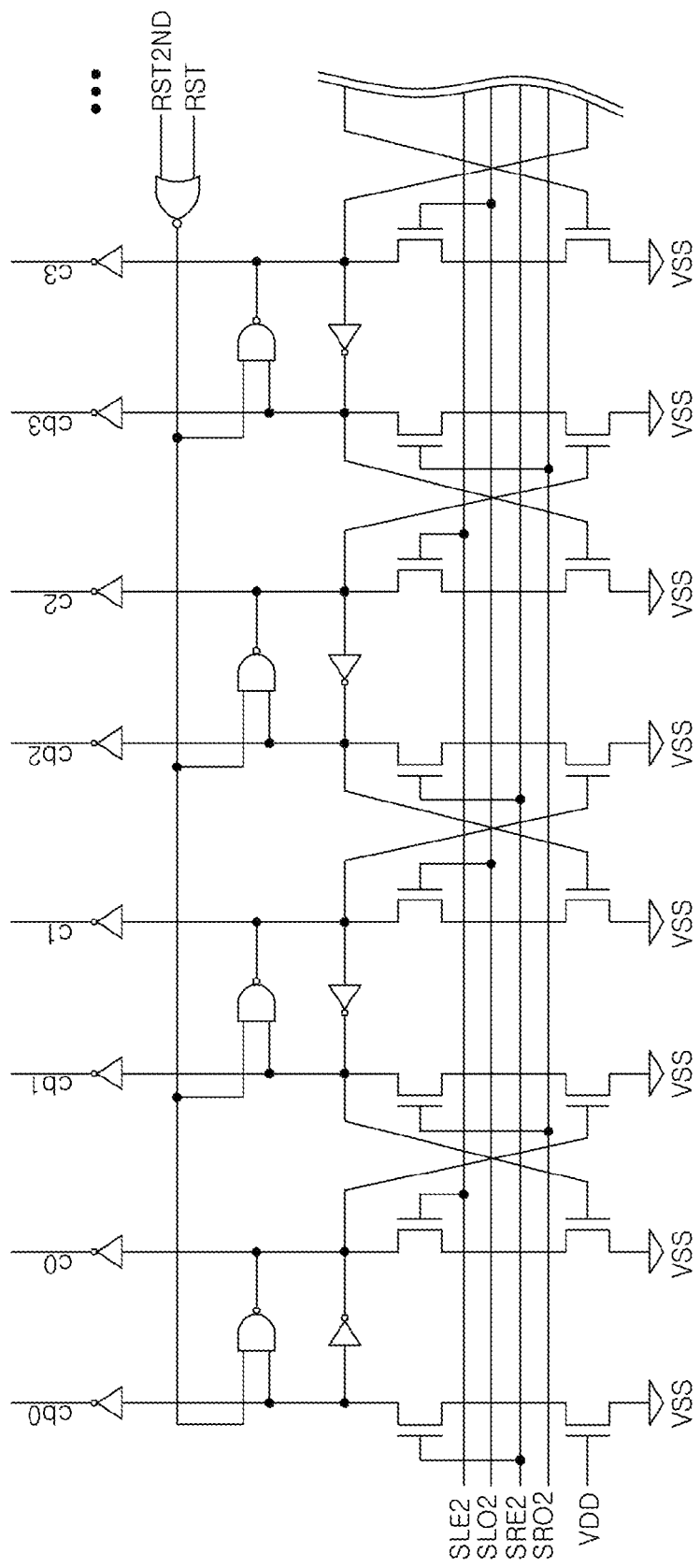

| | a0 | a1 | a2 | a3 | a4 | a5 | a6 | a7 | b0 | b1 | b2 | b3 | c0 | c1 | c2 | c3 | c4 | c5 | c6 | c7 |
|---|---|---|---|---|---|---|---|---|---|---|---|---|---|---|---|---|---|---|---|---|
| NORMAL OPERATION | H | H | H | H | H | H | H | L | L | L | L | L | L | L | L | L | L | L | L | L |
| 2NDEN→SET2ND | H | H | H | L | H | L | L | L | H | H | H | H | H | H | H | H | H | L | L | L |
| 2NDEN+2NDLOCK | H | H | H | L | L | L | L | L | H | H | H | H | H | H | H | H | H | L | L | L |
| MINDELAY | H | L | L | L | L | L | L | L | H | H | H | H | H | H | H | H | H | L | L | L |
| CHG2ND | H | H | H | H | H | H | H | H | H | H | H | H | H | H | H | H | H | L | L | L |

SYNCHRONIZATION CIRCUIT

CROSS-REFERENCE TO RELATED APPLICATION

The present application claims priority to Korean Application No. 10-2011-0002655, filed on Jan. 11, 2011, in the Korean Intellectual Property Office, which is incorporated herein by reference in its entirety as if set forth in full.

BACKGROUND

1. Technical Field

Various embodiments relate to a semiconductor circuit, and more particularly, to a synchronization circuit.

2. Related Art

For example, a semiconductor circuit generates an internal clock signal using an externally provided clock signal and outputs data using the internal clock signal.

Since the internal clock signal passes through various signal paths in a semiconductor memory, a timing error occurs between the internal clock signal and the externally provided clock signal.

Therefore, the semiconductor circuit uses a synchronization circuit in order to compensate for the timing error between the externally provided clock signal and the internal clock signal.

As illustrated in FIG. 1, a synchronization circuit 10 according the conventional art, that is, a delay locked loop (DLL) includes a delay line 11, a replica delay 12, a phase detector 13, a control unit 14, and a driver 15.

The delay line 11 delays an input signal ICLK by a variable delay time in response to control signals T0<0:M> and T1<0:N> and outputs a delayed signal.

The replica delay 12 is a delay circuit that duplicates a delay time of a signal path through which the input signal ICLK is output to an outside.

The phase detector 13 detects a phase difference between the input signal ICLK and the output signal of the replica delay 12, and outputs the phase difference.

The control unit 14 generates the control signals T0<0:M> and T1<0:N> to compensate for the phase difference between the input signal ICLK and the output signal of the replica delay 12 according to the output of the phase detector 13.

The driver 15 drives the output signal of the delay line 11 to output a delay locked clock signal DCLK.

As illustrated in FIG. 2, the delay line 11 includes a plurality of NAND gates for receiving the control signals T0<0:M>, and a plurality of unit delay cells (UDCs) for receiving the control signals T1<0:N>.

The number of the unit delay cells through which an input signal IN passes is determined according to the control signals T0<0:M> and T1<0:N>, so that it is possible to change the delay time of the input signal IN.

The synchronization circuit according to the conventional art performs a locking operation (delay locking operation) for adjusting tDL (a delay locking time) to have a minimum positive value in the range of tCK (a clock time)—tREP (a replica delay time).

At this time, when a change occurs in a power supply voltage provided to a semiconductor circuit, for example, when the power supply voltage does not reach a target level, the delay time (tREP) of the replica delay 12 may increase.

When the tREP increases, the tDL may be reduced to a negative value in a locking process.

Since the tDL is not allowed to have a negative value in an actual circuit, delay stuck occurs, resulting in the occurrence of a data output timing error.

Thus the synchronization circuit 10 according to the conventional art is designed such that locking with a tDL corresponding to 2*tCK-tREP is performed.

However, in order to perform the locking with the tDL corresponding to 2*tCK-tREP as described above, a delay line used increases, resulting in an increase in power consumption amount, a locking time, and jitter.

SUMMARY

Accordingly, there is a need for an improved synchronization circuit that may obviate one or more of the above-mentioned problems or disadvantages. In particular, there is a need for an improved synchronization circuit capable of reducing power consumption amount, a locking time, and jitter is described herein.

In the following description, certain aspects and embodiments will become evident. It should be understood that these aspects and embodiments are merely exemplary, and the invention, in its broadest sense, could be practiced without having one or more features of these aspects and embodiments.

In one exemplary aspect of the present invention, a synchronization circuit may comprise: a delay line; and a first loop and a second loop configured to share the delay line, wherein the second loop is activated when a number of unit delay cells used in the delay line is equal to or less than a predetermined number according to an operation of the first loop.

In another exemplary aspect, a synchronization circuit may comprise: a delay line; a first loop configured to control the delay line and perform a primary delay locking operation; and a second loop configured to control the delay line and perform a secondary delay locking operation, wherein the second loop is configured to set a delay time of the delay line as a time according to the secondary delay locking operation when a number of unit delay cells used in the delay line is minimal.

In still another exemplary aspect, a synchronization circuit may comprise: a delay line configured to delay an input signal by a predetermined delay time in response to a delay line control signal and generate a first delay signal and a second delay signal; a shift register configured to generate the delay line control signal in response to a first shift control signal, a second shift control signal, and a state control signal; a first loop configured to generate the first shift control signal in response to the input signal and a feedback signal; and a second loop configured to generate the second shift control signal and the state control signal in response to the first delay signal, the second delay signal, and the delay line control signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIGS. 9a to 9c are circuit diagrams of the shift register illustrated in FIG. 3;

DETAILED DESCRIPTION

Figure 1:
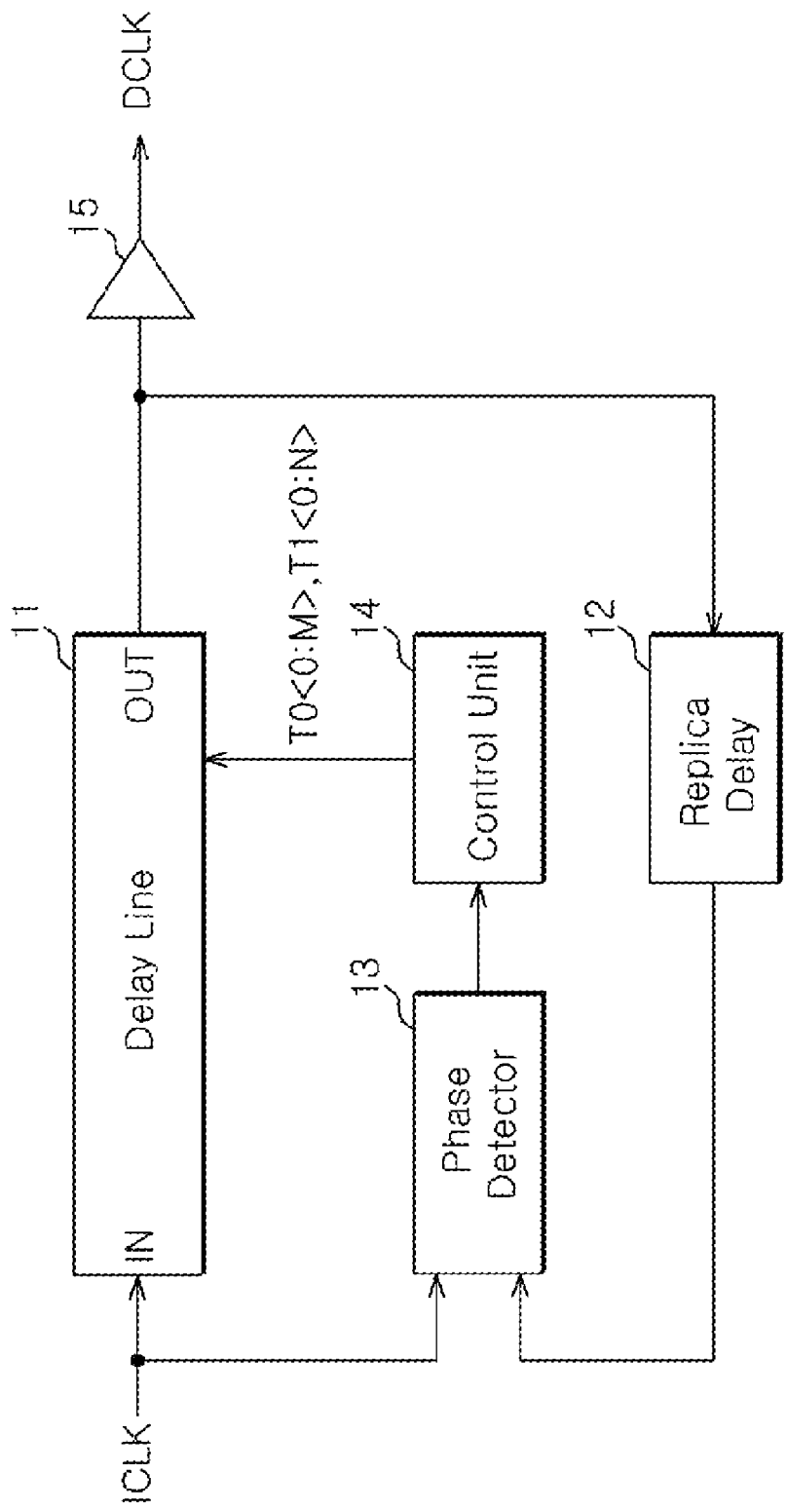
FIG. 1 is a block diagram of a synchronization circuit according to the conventional art.
Figure 2:
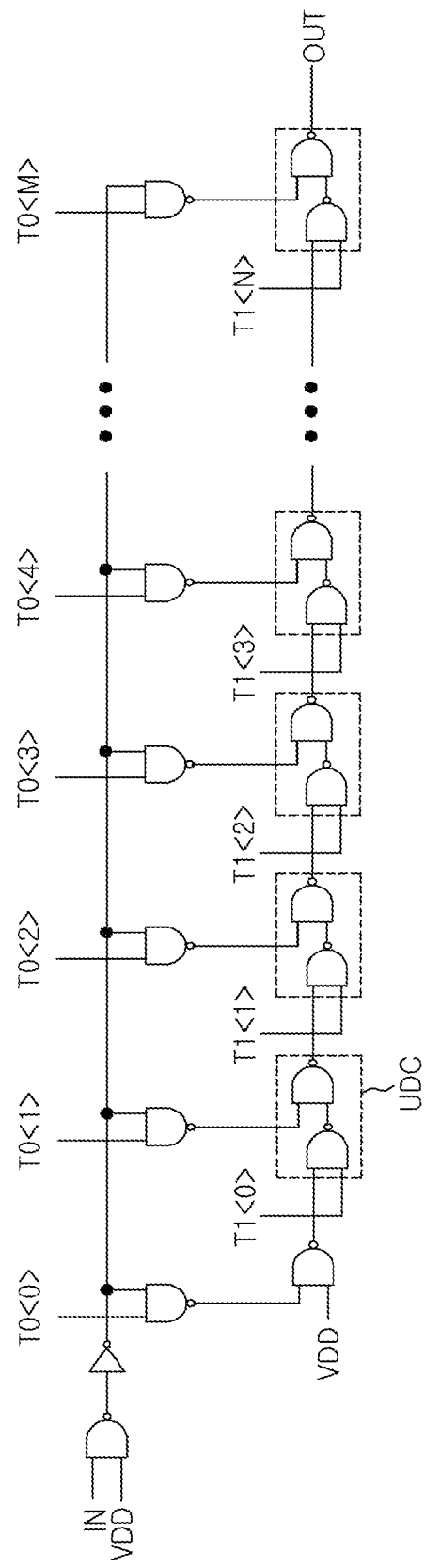
FIG. 2 is a circuit diagram of the delay line illustrated in FIG. 1.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 3:
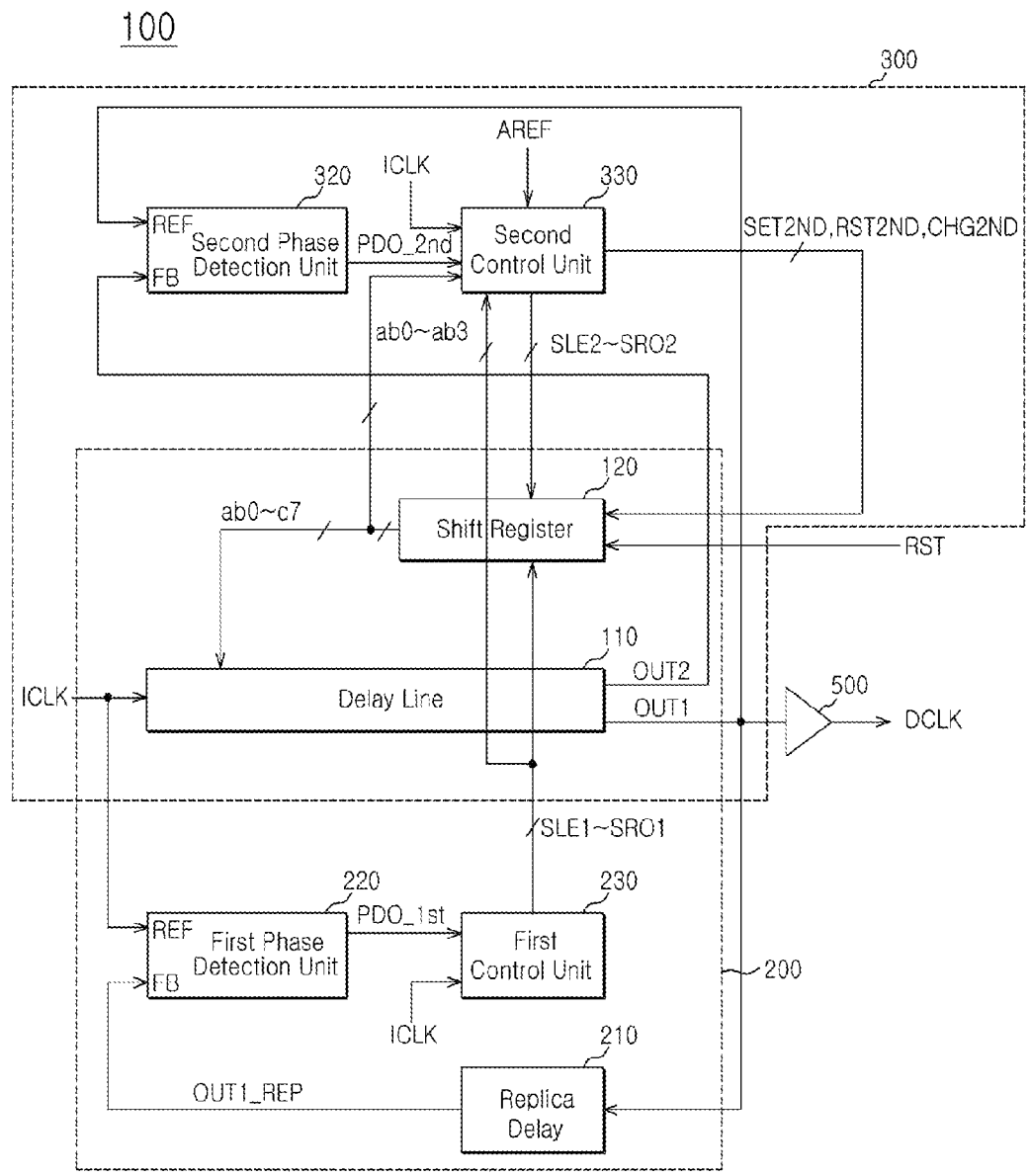
FIG. 3 is a block diagram of a synchronization circuit according to an embodiment.

As illustrated in FIG. 3, a synchronization circuit 100 according to one exemplary embodiment may include a first loop 200, a second loop 300, and a driver 500.

The first loop 200 and the second loop 300 are configured to share a delay line 110 and a shift register 120.

The delay line 110 is configured to delay an input signal ICLK in response to delay line control signals ab0, ab1, ab2, ..., c7 and generate a first delay signal OUT1 and a second delay signal OUT2.

The delay line 110 is configured such that delay times of the first delay signal OUT1 and the second delay signal OUT2 are changed in response to the delay line control signals ab0, ab1, ab2, ..., c7.

The delay line control signals ab0, ab1, ab2, ..., cb7 have logic levels opposite to those of the delay line control signals a0, a1, a2, ..., c7, respectively.

The shift register 120 is configured to generate the delay line control signals ab0 to cb7 in response to a reset signal RST, state control signals, first shift control signals SLE1 to SRO1, and second shift control signals SLE2 to SRO2.

The state control signals may include a second loop set signal SET2ND, a second loop reset signal RST2ND, and a loop change signal CHG2ND.

The driver 500 is configured to drive the first delay signal OUT1 and generate a delay locked clock signal DCLK.

The first loop 200 is configured to perform a primary locking operation for finding a locking point at which a phase of the input signal ICLK coincides with a phase of a feedback signal OUT1_REP.

The first loop 200 may include a replica delay 210, a first phase detection unit 220, and a first control unit 230.

The replica delay 210 is configured to delay the first delay signal OUT1 by a delay time, obtained by modeling an internal signal processing delay time of a semiconductor integrated circuit, and generate the feedback signal OUT1_REP.

The first phase detection unit 220 is configured to compare the phase of the input signal ICLK with the phase of the feedback signal OUT1_REP, and generate a first phase detection signal PDO_1st.

The first control unit 230 is configured to generate first shift control signals SLE1 to SRO1 in response to the first phase detection signal PD0_1st and the input signal ICLK.

The second loop 300 is configured to perform a secondary locking operation for finding a locking point at which a phase of the first delay signal OUT1 coincides with a phase of the second delay signal OUT2.

The second loop 300 allows the phase of the second delay signal OUT2 to coincide with the phase of the first delay signal OUT1 while substantially maintaining a delay time difference of 1tCK therebetween.

The second loop 300 may include a second phase detection unit 320 and a second control unit 330.

The second phase detection unit 320 is configured to compare the phase of the first delay signal OUT1 with the phase of the second delay signal OUT2 and generate a second phase detection signal PDO_2nd.

The second control unit 330 is configured to generate second shift control signals SLE2 to SRO2 in response to the second phase detection signal PDO_2nd, the input signal ICLK, the delay line control signals ab0 to ab3, and the first shift control signals SLE1 to SRO1.

Figure 4:
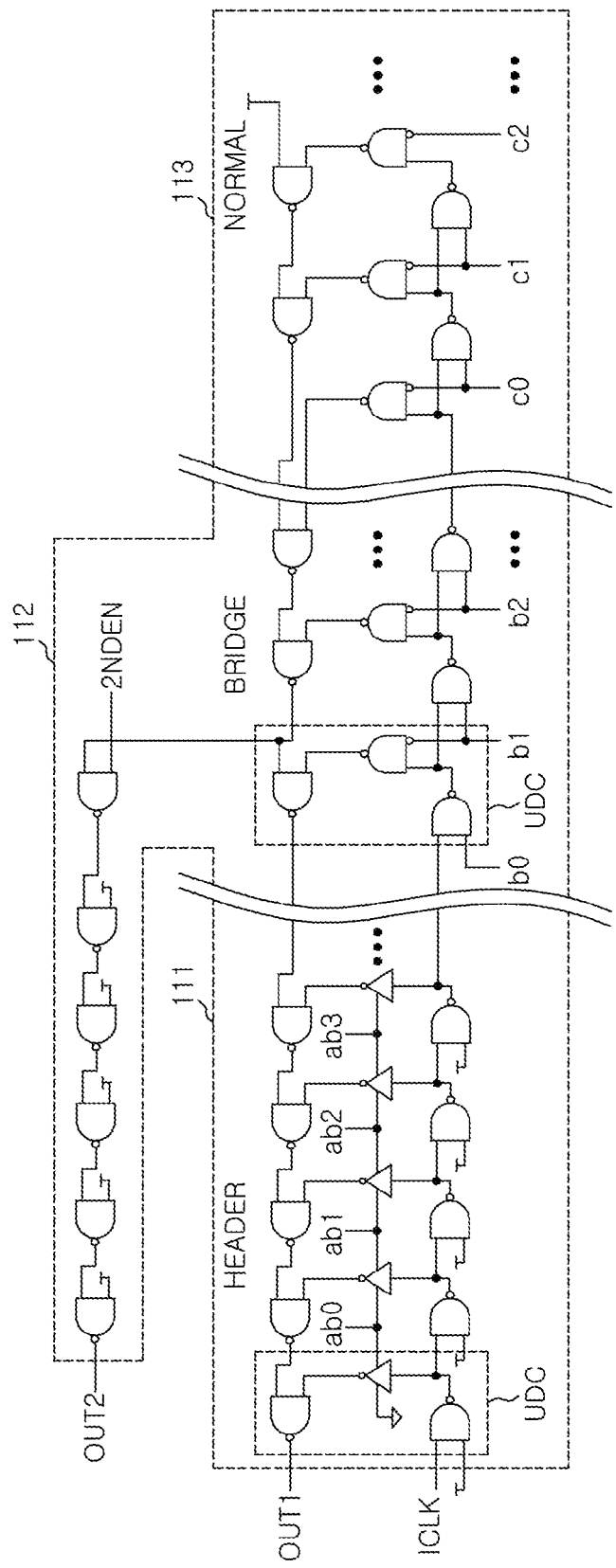
FIG. 4 is a circuit diagram of the delay line illustrated in FIG. 3.

As illustrated in FIG. 4, the delay line 110 may include a first delay path, that is, a signal path through which the input signal ICLK is delayed in the primary locking operation and the first delay signal OUT1 is generated, and a second delay path, that is, a signal path through which the input signal ICLK is delayed in the secondary locking operation and the second delay signal OUT2 is generated.

The first delay path and the second delay path may share unit delay cells, or use separate unit delay cells.

The delay line 110 may be classified into first to third delay lines, a header 111, a bridge 112, and a normal 113.

The header 111 is used for the primary locking operation and outputs the first delay signal OUT1.

The bridge 112 activates the output of the second delay signal OUT2.

The normal 113 is used for the secondary locking operation.

The header 111 is controlled by the delay line control signals ab0, ab1, ab2, ab3, ..., the bridge 112 is controlled by the delay line control signals b0, b1, b2, ..., and a second loop activation signal 2NDEN, and the normal 113 is controlled by the delay line control signals c0, c1, c2, ....

The header 111 allows the input signal ICLK to bypass as the delay line control signals ab0, ab1, ab2, ab3, ... are at a logical high level.

Each unit delay cell UDC of the header 111 may respectively include a combination of a NAND gate, a three-state inverter, and a NAND gate.

If the second loop activation signal 2NDEN is activated to a logical high level in a state where the delay line control signals b0, b1, b2, ... are activated to a logical high level, the bridge 112 outputs the input signal ICLK, which has passed through the header 111, the bridge 112, and the normal 113, as the second delay signal OUT2.

Each unit delay cell UDC of the bridge 112 may respectively include a combination of a NAND gate, a NAND gate, and a NAND gate.

Figure 5:
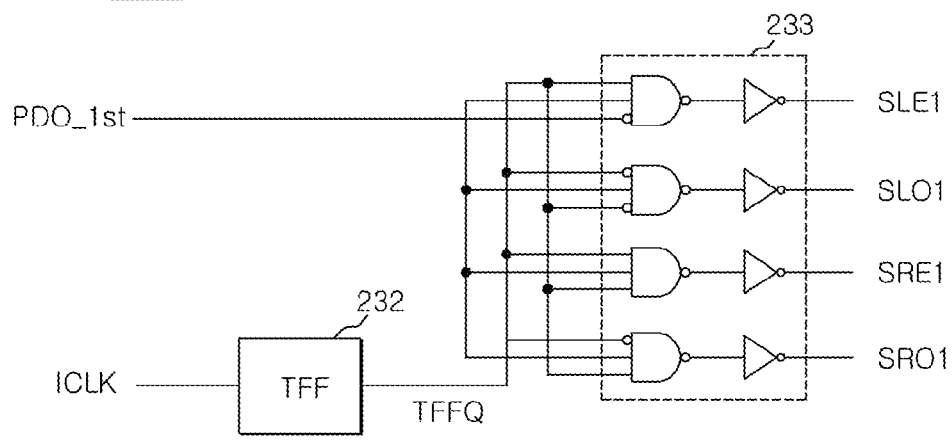
FIG. 5 is a circuit diagram of the first control unit illustrated in FIG. 3.

As illustrated in FIG. 5, the first control unit 230 may include a flip-flop 232 and a decoding logic 233.

The flip-flop 232 may include a T flip-flop and is configured to generate an output signal TFFQ in response to the input signal ICLK.

The decoding logic 233 is configured to combine the first phase detection signal PD0_1st with the output signal TFFQ and generate the first shift control signals SLE1 to SRO1.

The first shift control signals SLE1 to SRO1 are used to increase/decrease the delay time of the delay line 110.

Figure 6:
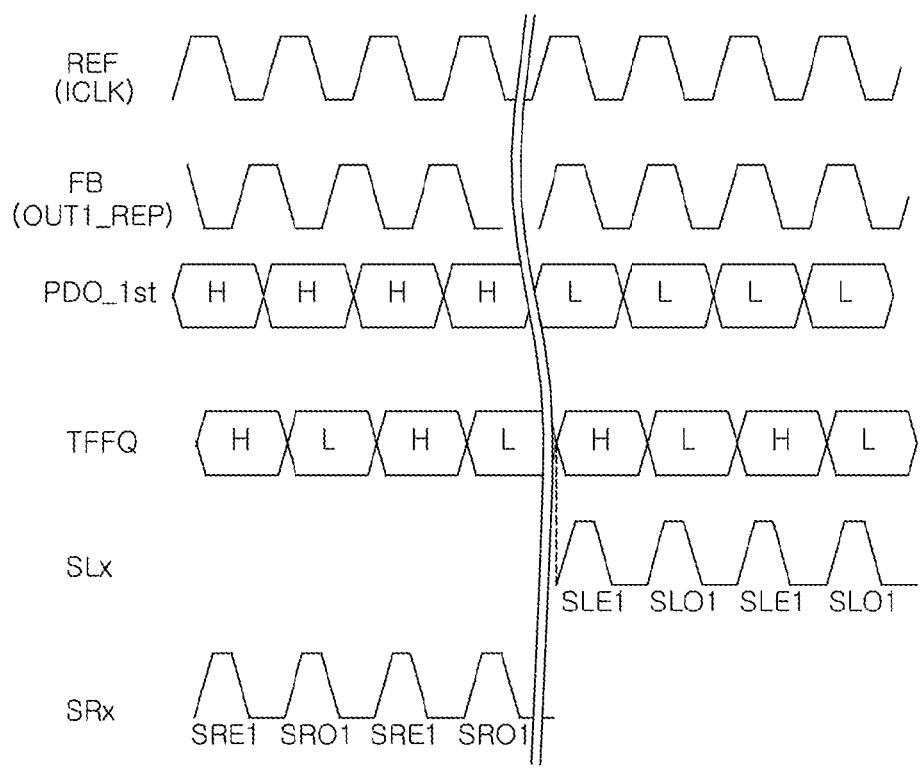
FIG. 6 is a diagram illustrating an operation timing of the first control unit illustrated in FIG. 5.

As illustrated in FIG. 6, when the first phase detection signal PDO_1st is at a logical high H level, the first control unit 230 repeatedly generates the first shift control signal SRE1 and the first shift control signal SRO1 using the input signal ICLK and the output signal TFFQ of the flip-flop 232.

When the first phase detection signal PDO_1st is at a logical low L level, the first control unit 230 repeatedly generates the first shift control signal SLE1 and the first shift control signal SLO1 using the input signal ICLK and the output signal TFFQ of the flip-flop 232.

Figure 7:
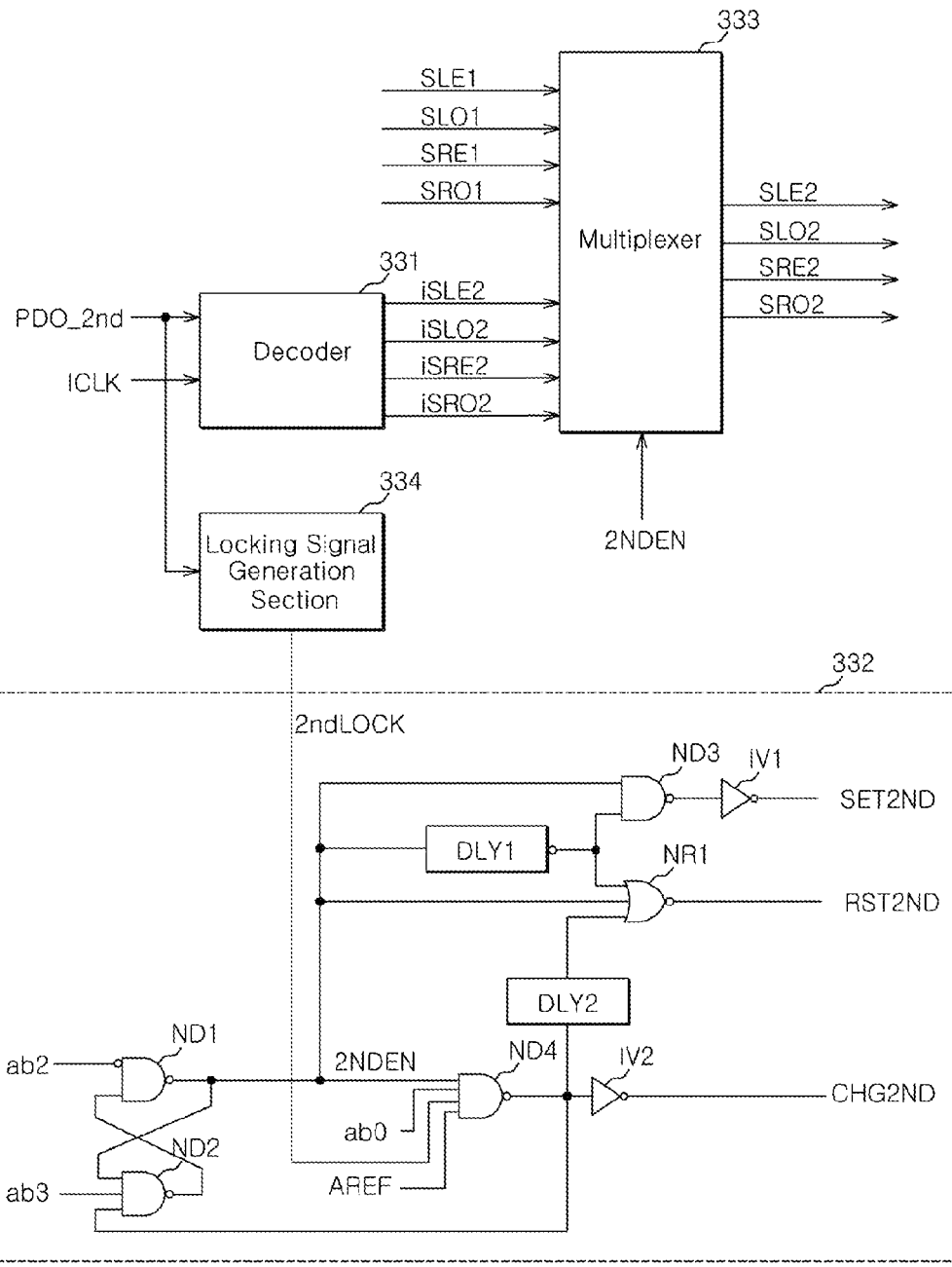
FIG. 7 is a block diagram illustrating the internal configuration of the second control unit illustrated in FIG. 3.

As illustrated in FIG. 7, the second control unit 330 may include a decoder 331, a state machine 332, a multiplexer 333, and a locking signal generation section 334.

The decoder 331 is configured to generate preliminary shift control signals iSLE2 to iSRO2 in response to the second phase detection signal PDO_2nd and the input signal ICLK.

The decoder 331 may have a configuration which is substantially equal to that of the first control unit 230.

The multiplexer 333 is configured to output one of the first shift control signals SLE1 to SRO1 or the preliminary shift control signals iSLE2 to iSRO2 as the second shift control signals SLE2 to SRO2 in response to the second loop activation signal 2NDEN.

When a second locking point is found, for example, when the second phase detection signal PDO_2nd is changed to a logic level different from a previous level, the locking signal generation section 334 activates a second locking signal 2ndLOCK.

The state machine 332 is configured to generate the second loop activation signal 2NDEN and the state control signals SET2ND, RST2ND and CHG2ND in response to the delay line control signals ab0, ab2 and ab3, the second locking signal 2ndLOCK, and an auto-refresh signal AREF.

The state machine 332 may include NAND gates ND1 to ND4, a NOR gate NR1, inverters IV1 and IV2, and delays DLY1 and DLY2. The delay DLY1 is configured to delay an input signal for a predetermined time, invert the delayed input signal, and output an inverted signal. The pulse widths of the state control signals SET2ND and RST2ND are determined by the delay DLY1.

Figure 8:
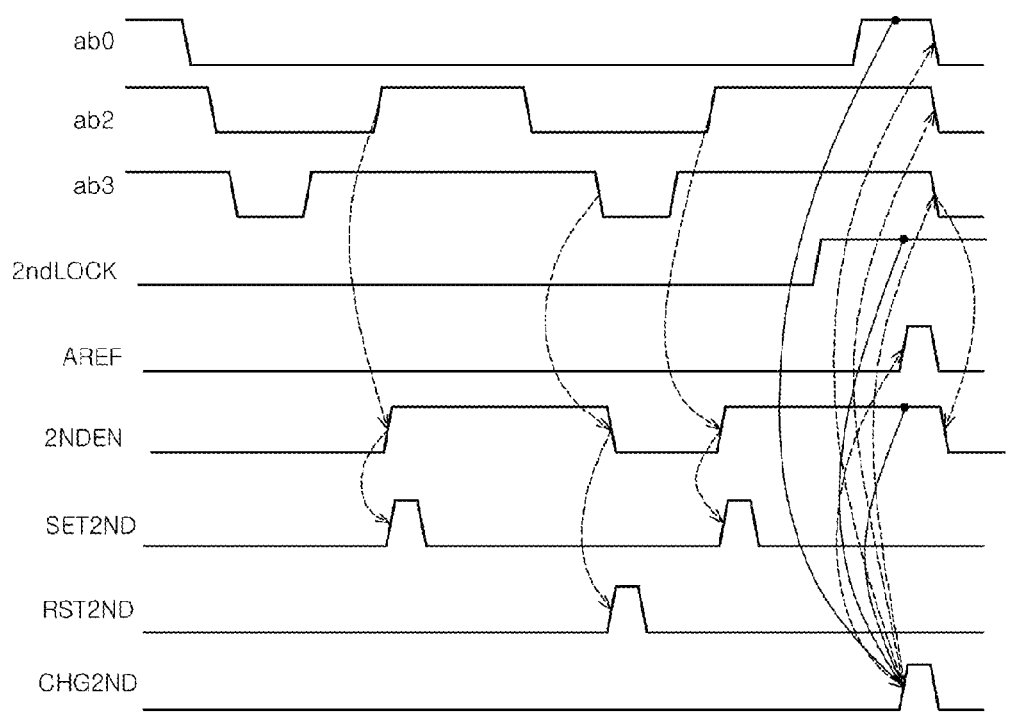
FIG. 8 is a diagram illustrating an operation timing of the state machine illustrated in FIG. 7.

The operation of the state machine 332 will be described with reference to FIG. 8 below.

When the delay line control signal ab2 is at a logical high level, the second loop activation signal 2NDEN is activated to a logical high level. When the delay line control signal ab3 is at a logical low level, the second loop activation signal 2NDEN is deactivated to a logical low level.

Furthermore, the second loop activation signal 2NDEN is deactivated to the logical low level even when the delay line control signal ab0, the second locking signal 2ndLOCK, and the auto-refresh signal AREF are respectively at logical high levels during a period when the second loop activation signal 2NDEN is at the logical high level.

At this time, the delay line control signal ab3 is periodically at a logical low level in a normal operation, and is also at the logical low level in an initialization operation.

As the second loop activation signal 2NDEN is activated to the logical high level, the second loop set signal SET2ND is generated, and thus the second loop 300 of FIG. 3 operates to find the second locking point. When second locking point is found, the second locking signal 2ndLOCK is activated to a logical high level.

As the second loop activation signal 2NDEN is deactivated to the logical low level, the second loop reset signal RST2ND is generated.

Meanwhile, when the loop change signal CHG2ND is generated, the second loop reset signal RST2ND should not be generated. In this regard, the delay DLY2 is provided to substantially prevent the second loop reset signal RST2ND from being generated when the loop change signal CHG2ND is generated.

When the delay line control signal ab0, the second locking signal 2ndLOCK, and the auto-refresh signal AREF are at a logical high level during a period when the second loop activation signal 2NDEN is at the logical high level, the loop change signal CHG2ND is activated to a logical high level.

At this time, the loop change signal CHG2ND determines a loop change timing. That is, the loop change signal CHG2ND determines a timing at which the delay time of the delay line 110 is changed to a delay time locked by the second loop 300. Thus, even if a glitch due to loop change is included in the delay locked clock signal DCLK, an operation duration (for example, an auto-refresh duration) not affecting the operation of a semiconductor circuit should have priority. Consequently, as a condition for activating the loop change signal CHG2ND to a logical high level, it is possible to use, for example in a non-read-based command, the auto-refresh signal AREF generated according to an auto-refresh command.

As the loop change signal CHG2ND is activated to the logical high level, the second loop activation signal 2NDEN is deactivated to the logical low level.

Figure 9A:
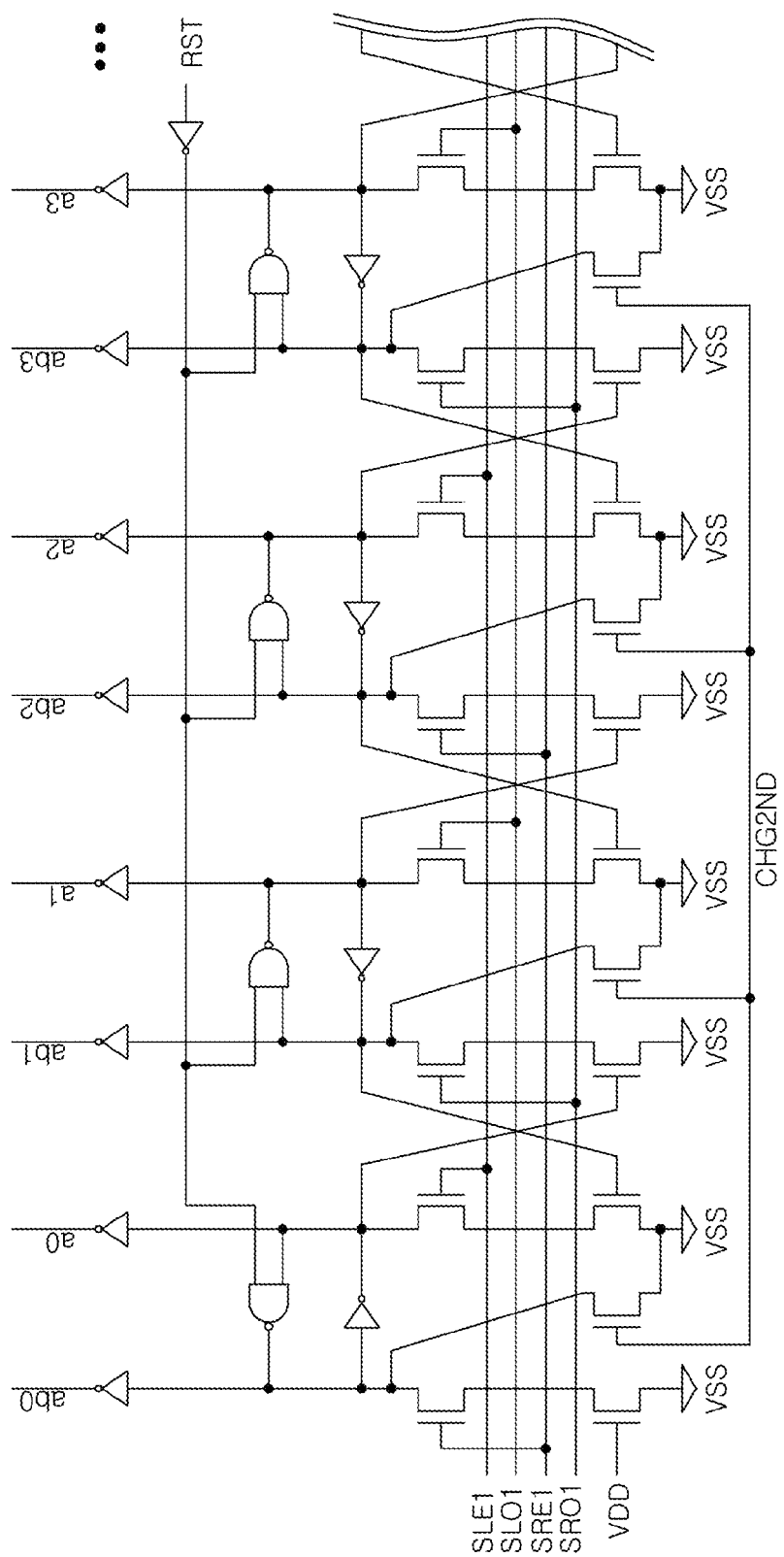
Figure 9B:
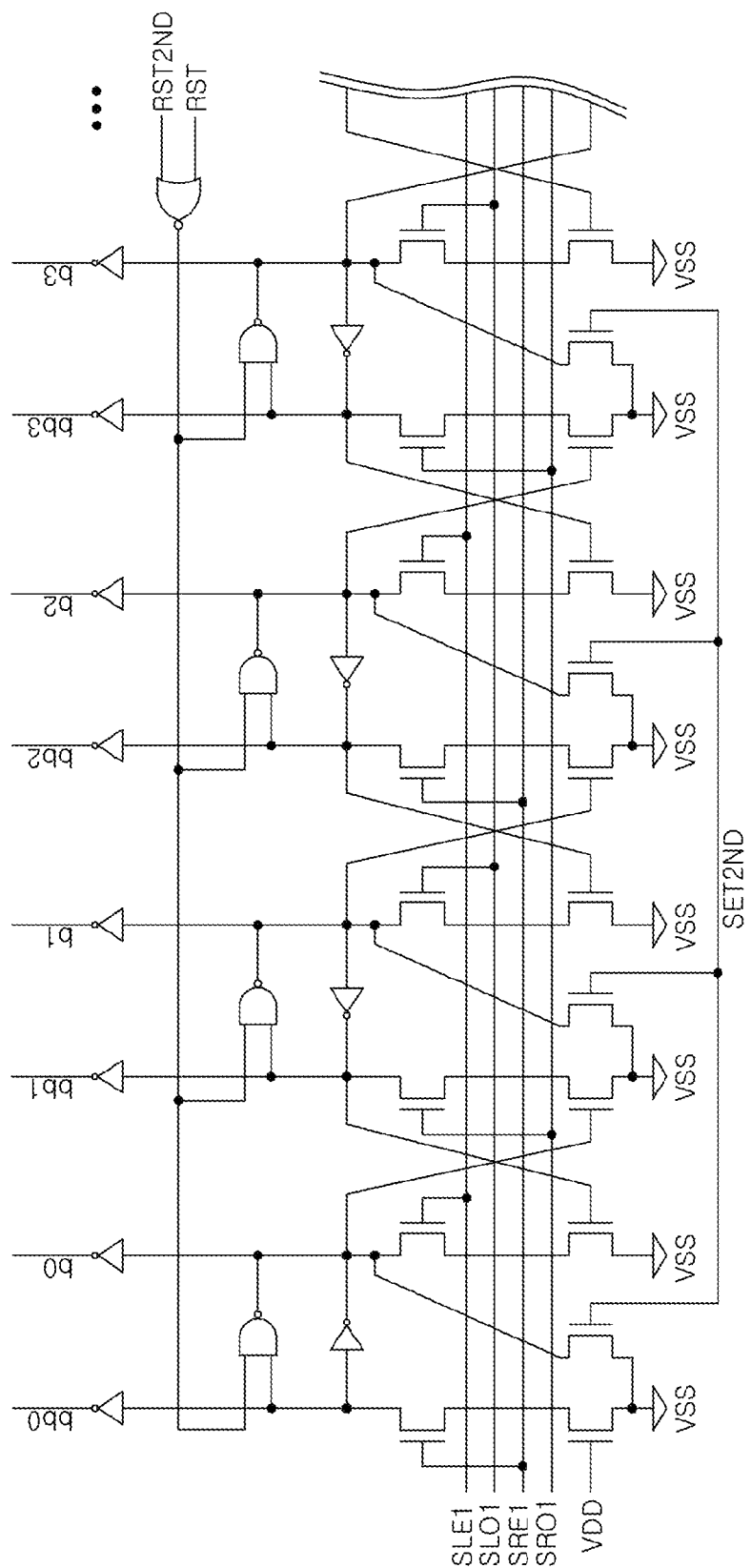

As illustrated in FIGS. 9a to 9c, the shift register 120 may include first to third shift register units, a header 121, a bridge 122, and a normal 123.

The header 121, the bridge 122, and the normal 123 correspond to the header 111, the bridge 112, and the normal 113 of the delay line 110 illustrated in FIG. 4, respectively.

The header 121, the bridge 122, and the normal 123 are provided to control the header 111, the bridge 112, and the normal 113 of the delay line 110 illustrated in FIG. 4, respectively.

As illustrated in FIG. 9a, the header 121 is configured to shift the delay line control signals ab0, a0, ab1, a1, ab2, a2, ab3 and a3 in response to the first shift control signals SLE1 to SRO1.

When the loop change signal CHG2ND is activated to a logical high level, the header 121 outputs the delay line control signals ab0, ab1, ab2, ab3 at a logical high level.

The header 121 is initialized as a reset signal RST is activated to a logical high level. That is, the header 121 changes the delay line control signal a0 to a logical high level and changes the other delay line control signals a1, a2, a3 to a logical low level.

As illustrated in FIG. 9b, the bridge 122 is configured to shift the delay line control signals bb0, b0, bb1, b1, bb2, b2, bb3 and b3 in response to the first shift control signals SLE1 to SRO1.

When the second loop set signal SET2ND is activated to a logical high level, the bridge 122 outputs the delay line control signals b0, b1, b2, b3 at a logical high level.

The bridge 122 is initialized as either the reset signal RST or the second loop reset signal RST2ND is activated to a logical high level. That is, the bridge 122 changes the delay line control signals b0, b1, b2, b3 to a logical low level.

As illustrated in FIG. 9c, the normal 123 is configured to shift the delay line control signals cb0, c0, cb1, c1, cb2, c2, cb3 and c3 in response to the second shift control signals SLE2 to SRO2.

The normal 123 is initialized as either the reset signal RST or the second loop reset signal RST2ND is activated to a logical high level. That is, the normal 123 changes the delay line control signals c0, c1, c2, c3 to a logical low level.

Figures 10, 11:
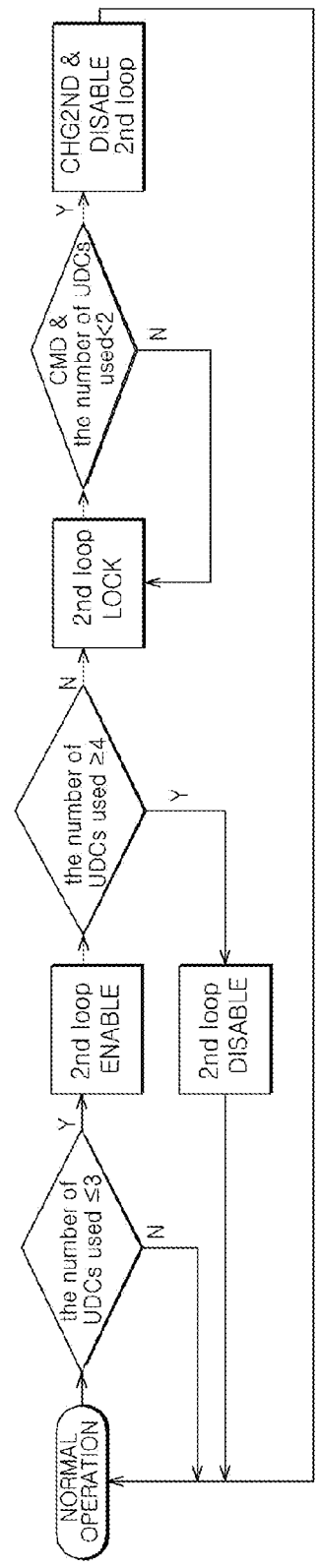
FIG. 10 is a chart illustrating an operation timing of the shift register illustrated in FIGS. 9a to 9c.
FIG. 11 is a flowchart illustrating an operation of a synchronization circuit according to an embodiment.

The operation of the shift register 120 illustrated in FIGS. 9a to 9c will be described with referenced to FIG. 10 below.

In a normal operation, the shift register 120 generates the delay line control signals a0 to a6 (=H) according to the operation of the first loop 200.

The delay time of the header 111 increases in response to the delay line control signals a0 to a6 (=H) (refer to FIG. 4), so that the primary locking operation is performed.

Meanwhile, when the second loop set signal SET2ND is generated in response to the activation of the second loop activation signal 2NDEN, the shift register 120 changes the delay line control signals b0 to b3 to a logical high level, so that the second delay signal OUT2 is outputted.

The shift register 120 generates the delay line control signals c0 to c4 (=H) according to the operation of the second loop 300.

The delay time of the normal 113 increases in response to the delay line control signals c0 to c4 (=H) (refer to FIG. 4), so that the secondary locking operation is performed.

The secondary locking operation is performed so that the phase of the second delay signal OUT2 coincides with the phase of the first delay signal OUT1 while maintaining a delay time difference of 1tCK therebetween.

After the secondary locking operation is performed, and the delay time of the header 111 is reduced to a minimum, that is, only one unit delay cell is used (a0=H, a1 to a7=L), the loop change signal CHG2ND is generated.

After the loop change signal CHG2ND is generated, the shift register 120 changes the delay line control signals a0 to a7 to a logical high level.

The operation of the synchronization circuit 100 according to one embodiment will be described with reference to FIGS. 4 and 11 below.

First, the conventional art is designed such that a locking operation with a tDL corresponding to 2*tCK-tREP is performed.

However, the embodiment of the present invention uses a dual locking scheme in which a primary locking operation with a tDL corresponding to *tCK-tREP is basically performed and a final locking operation is performed through a secondary locking operation only in a specific situation. The specific situation is a case in which the level of a power supply voltage (for example, VDD) provided to a semiconductor circuit is lowered whereby the delay time (tREP) of the replica delay 210 increases, resulting in the occurrence of an error in the primary locking operation.

A normal operation, that is, the primary locking operation, is performed by increasing the number of the unit delay cells of the header 111.

When the level of the power supply voltage is lowered and the number of the unit delay cells used in the header 111 is equal to or less than n (for example, 3), the second loop 300 is activated.

If the number of the unit delay cells used in the header 111 is minimal (that is, 1), an error may occur in the locking operation since there are no unit delay cells to be reduced. In this regard, the second loop 300 is activated in advance to allow the total number of unit delay cells used in the delay line 110 to be equal to or more than n.

As the second loop 300 is activated, the secondary locking operation is performed by increasing the number of the unit delay cells in the normal 113.

At this time, the level of the power supply voltage may increase again to a normal level. Thus, it is determined whether the number of the unit delay cells used in the header 111 is equal to or more than m (for example, 4).

When the number of the unit delay cells used in the header 111 is equal to or more than 4, the second loop 300 is deactivated.

Meanwhile, when the number of the unit delay cells used in the header 111 is equal to or less than 3, the secondary locking operation is completed by continuously increasing the number of the unit delay cells in the normal 113.

When the number of the unit delay cells used in the header 111 is minimal (that is, 1), the loop change signal CHG2ND is generated in response to the auto-refresh signal AREF generated according to the non-read-based command, that is, the auto-refresh command. As the loop change signal CHG2ND is generated, the delay time of the delay line 110 is set to the time according to the secondary locking operation of the second loop 300 rather than the first loop 200, and the second loop activation signal 2NDEN is deactivated.

As the second loop activation signal 2NDEN is deactivated, the output of the second delay signal OUT2 is blocked. An internal delay signal of the delay line 110, which has a phase coinciding with that of the first delay signal OUT1 with a delay time difference of 1tCK therebetween through the secondary locking operation, is output as the first delay signal OUT1.

Then, the first loop 200 performs the primary locking operation by controlling the delay line 110 with the delay time set according to the secondary locking operation of the second loop 300.

According to the embodiment, two loop circuits configured to find independent locking points are selectively used according to delay locking time (tDL) conditions, so that it is possible to reduce a power consumption amount, a locking time, and jitter.

While certain embodiments have been described above, it will be understood to those skilled in the art that the embodiments described are by way of example only. Accordingly, the synchronization circuit described herein should not be limited based on the described embodiments. Rather, the synchronization circuit described herein should only be limited in light of the claims that follow when taken in conjunction with the above description and accompanying drawings.

What is claimed is:

1. A synchronization circuit comprising:
a delay line; and
a first loop and a second loop configured to share the delay line,
wherein the second loop is activated when a number of unit delay cells used in the delay line is equal to or less than a predetermined number according to an operation of the first loop.

2. The synchronization circuit according to claim 1, wherein the first loop and the second loop are configured to perform independent delay locking operations, respectively.

3. The synchronization circuit according to claim 1, wherein the second loop is configured to be activated or deactivated according to the number of the unit delay cells used in the delay line.

4. The synchronization circuit according to claim 1, wherein the delay line comprises:

a first delay path configured to delay an input signal in a delay locking operation of the first loop and generate a first delay signal; and a second delay path configured to delay the input signal in a delay locking operation of the second loop and generate a second delay signal.

5. The synchronization circuit according to claim 1, wherein the delay line comprises:
a first delay line configured to delay an input signal in a delay locking operation of the first loop and generate a first delay signal;
a second delay line configured to activate an output of a second delay signal in a delay locking operation of the second loop; and
a third delay line configured to delay an input signal in the delay locking operation of the second loop and generate the second delay signal.

6. The synchronization circuit according to claim 5, wherein, a delay time of the delay line is set as a time according to the delay locking operation of the second loop when the number of unit delay cells used in the delay line is minimal.

7. The synchronization circuit according to claim 5, further comprising:
a shift register configured to be shared by the first loop and the second loop and control the delay line.

8. The synchronization circuit according to claim 7, wherein the shift register comprises:
a first shift unit configured to control the first delay line;
a second shift unit configured to control the second delay line; and
a third shift unit configured to control the third delay line.

9. A synchronization circuit comprising:
a delay line;
a first loop configured to control the delay line and perform a primary delay locking operation; and
a second loop configured to control the delay line and perform a secondary delay locking operation,
wherein the second loop is configured to set a delay time of the delay line as a time according to the secondary delay locking operation when a number of unit delay cells used in the delay line is minimal.

10. The synchronization circuit according to claim 9, wherein the second loop is configured to be activated or deactivated according to the number of the unit delay cells used in the delay line.

11. The synchronization circuit according to claim 9, wherein the delay line comprises:
a first delay path configured to delay an input signal in the primary delay locking operation and generate a first delay signal; and
a second delay path configured to delay the input signal in the secondary delay locking operation and generate a second delay signal.

12. The synchronization circuit according to claim 9, wherein the delay line comprises:
a first delay line configured to delay an input signal in the primary delay locking operation and generate a first delay signal;
a second delay line configured to activate output of a second delay signal in the secondary delay locking operation; and
a third delay line configured to delay an input signal in the secondary delay locking operation and generate the second delay signal.

13. The synchronization circuit according to claim 12, further comprising:

a shift register configured to be shared by the first loop and the second loop and control the delay line.

14. The synchronization circuit according to claim 13, wherein the shift register comprises:
a first shift unit configured to control the first delay line;
a second shift unit configured to control the second delay line; and
a third shift unit configured to control the third delay line.

15. A synchronization circuit comprising:
a delay line configured to delay an input signal by a predetermined delay time in response to a delay line control signal and generate a first delay signal and a second delay signal;
a shift register configured to generate the delay line control signal in response to a first shift control signal, a second shift control signal, and a state control signal;
a first loop configured to generate the first shift control signal in response to the input signal and a feedback signal; and
a second loop configured to generate the second shift control signal and the state control signal in response to the first delay signal, the second delay signal, and the delay line control signal.

16. The synchronization circuit according to claim 15, wherein the delay line comprises:
a first delay line configured to delay the input signal when the first loop operates and generate the first delay signal;
a second delay line configured to activate output of the second delay signal when the second loop operates; and
a third delay line configured to delay the input signal when the second loop operates and generate the second delay signal.

17. The synchronization circuit according to claim 15, wherein the state control signal includes a second loop set signal, a second loop reset signal, and a loop change signal.

18. The synchronization circuit according to claim 17, wherein the shift register comprises:
a first shift unit configured to generate the delay line control signal in response to the first shift control signal and the loop change signal;
a second shift unit configured to generate the delay line control signal in response to the first shift control signal, the second loop set signal, and the second loop reset signal; and
a third shift unit configured to generate the delay line control signal in response to the second shift control signal and the second loop set signal.

19. The synchronization circuit according to claim 15, wherein the first loop comprises:
a replica delay configured to delay the first delay signal by a delay time obtained by modeling an internal signal processing delay time of a semiconductor integrated circuit and generate a feedback signal;
a phase detection unit configured to compare a phase of the input signal with a phase of the feedback signal and generate a first phase detection signal; and
a control unit configured to generate the first shift control signal in response to the first phase detection signal and the input signal.

20. The synchronization circuit according to claim 15, wherein the second loop comprises:
a phase detection unit configured to compare a phase of the first delay signal with a phase of the second delay signal and generate a phase detection signal; and
a control unit configured to generate the second shift control signal and the state control signal in response to the input signal, the phase detection signal, the delay line control signal, and the first shift control signal.

21. The synchronization circuit according to claim 20, wherein the control unit is configured to output the first shift control signal as the second shift control signal when the second loop is not activated.

22. The synchronization circuit according to claim 20, wherein the control unit is configured to generate the state control signal for changing a delay time of the delay line to a delay time corresponding to the second shift control signal, in response to the delay line control signal, a delay locked signal, and a non-read-based command.

23. The synchronization circuit according to claim 22, wherein the non-read-based command comprises an auto-refresh command.

24. The synchronization circuit according to claim 20, wherein the control unit comprises:
- a decoder configured to generate a preliminary shift signal in response to the phase detection signal and the input signal;
- a state machine configured to generate a second loop activation signal and the state control signal in response to the delay line control signal, a delay locked signal, and a non-read-based command; and
- a multiplexer configured to select one of either the first shift control signal or the preliminary shift signal in response to the second loop activation signal, and output a selected signal as the second shift control signal.

* * * * *